United States Patent
White

(10) Patent No.: US 6,943,714 B2
(45) Date of Patent: Sep. 13, 2005

(54) METHOD AND APPARATUS OF OBTAINING POWER COMPUTATION PARAMETERS

(75) Inventor: Bert White, Irvine, CA (US)

(73) Assignee: TDK Semiconductor Corporation, Irvine, CA (US)

( * ) Notice: Subject to any disclaimer, the term of this patent is extended or adjusted under 35 U.S.C. 154(b) by 131 days.

(21) Appl. No.: 10/637,969

(22) Filed: Aug. 7, 2003

(65) Prior Publication Data

US 2004/0032357 A1 Feb. 19, 2004

Related U.S. Application Data

(60) Provisional application No. 60/404,554, filed on Aug. 19, 2002.

(51) Int. Cl.⁷ ................................................ H03M 1/00
(52) U.S. Cl. ....................... 341/141; 341/118; 341/155
(58) Field of Search ................................ 341/110, 118, 341/120, 141, 143, 155

(56) References Cited

U.S. PATENT DOCUMENTS

| | | | |
|---|---|---|---|
| 4,672,555 A | | 6/1987 | Hart et al. |
| 5,544,089 A | | 8/1996 | Hemminger et al. |
| 5,870,047 A | * | 2/1999 | Piesinger .................... 341/143 |
| 6,058,354 A | | 5/2000 | Adame et al. |
| 6,081,215 A | * | 6/2000 | Kost et al. .................. 341/120 |
| 6,238,589 B1 | | 5/2001 | Cooper et al. |
| 6,255,973 B1 | * | 7/2001 | Smith et al. ................ 341/141 |
| 6,341,135 B1 | | 1/2002 | Fawal et al. |
| 6,466,615 B1 | * | 10/2002 | Song ........................... 375/232 |
| 6,522,282 B1 | * | 2/2003 | Elbornsson ................. 341/155 |
| 6,555,997 B1 | | 4/2003 | De Vries et al. |

FOREIGN PATENT DOCUMENTS

| | | |
|---|---|---|
| EP | 0 591 942 A1 | 4/1994 |
| GB | 1 575 148 | 9/1980 |
| GB | 1 575 289 | 9/1980 |

OTHER PUBLICATIONS

XP 002269086, 1999, Iwansson et al., p. 160, 164, 186.

* cited by examiner

*Primary Examiner*—Michael Tokar
*Assistant Examiner*—Linh V Nguyen
(74) *Attorney, Agent, or Firm*—The Hecker Law Group

(57) ABSTRACT

A method and apparatus for obtaining power computation parameters is presented. Accurate computation of power requires multiplying voltage and current at the same instant of time and integrating the results over time. The present invention provides a method of using a single Analog to Digital Converter to convert both voltage and current for all the phases of any electrical system and then digitally compensating for the phase error caused by the non-simultaneous sampling of the current and voltage signals. The compensating filter could be implemented as a simple interpolator, an all-pass filter, or a combination of both. A single multiplexer is used to select which signal is processed by the Analog to Digital Converter. By scheduling and converting the voltage and analog signals one at a time, potential for crosstalk is significantly reduced, power requirement is reduced, and die size requirement is reduced.

27 Claims, 13 Drawing Sheets

METHOD AND APPARATUS OF OBTAINING POWER COMPUTATION PARAMETERS

PRIORITY

This non-provisional application claims of U.S. Provisional Application No. 60/404,554 entitled "Method and Apparatus for Obtaining Power Computation Parameters", filed Aug. 19$^{th}$, 2002, specification of which is herewith incorporated by reference.

BACKGROUND OF INVENTION

This invention relates to the field of power measurement. More specifically, this invention relates to efficient and accurate measurement of electrical power consumption.

Most household devices run on electrical power. In fact, a majority of personal and business devices in today's economy run on electrical power. Thus, accurately measuring electrical power consumption has become of paramount importance. Instruments used for measuring power are known as watthour meters. Watthour meters may be single-phase or multi-phase systems. Single-phase systems measure the power from a single incoming voltage and current. Multi-phase systems are used to measure power from a multi-wave power source. A multi-phase power source is an electrical system with multiple waveforms of power superimposed upon one another with a phase shift between waveforms. Typical electrical systems are one phase, two phases, or three phases. Note that power meters and watthour meters are used interchangeably throughout this specification to represent power measurement devices.

Typically, power companies maintain watthour meters of the old mechanical kind in every household. These meters are intended to provide a power company a measure of how much electrical power a household uses during a specified period for billing and statistical purposes. Historical knowledge of how much power all customers of a utility uses helps determine power generation requirements. Thus, a utility company with accurate measure of historical power usage of its customers is able to bill accurately and build new power infrastructures in anticipation of increasing demands. Accurate measure of power is important to a utility to avoid waste due to excess power generating capacity.

Power is measured at instants of time, however determination of total power consumption requires integration of power used over a specified period of time. Electrical power is the product of voltage (V) and current (I). Thus watthour meters generate the product of voltage and current and accumulate (i.e., integrate) the product over time.

In multi-phase systems, the power equation varies depending on the desired combination of current and voltages from the different phases. With advancement in digital technology, new watthour meters perform the power computation digitally thus the desired power equation may be programmed in a microcomputer. For digital computation of power, the voltage and current, which are typically analog, are sampled and converted to their digital representation before the product is computed. In multi-phase systems, several voltage and current products (V*I) are calculated and summed together to generate power.

Watthour meters have current transformers, or their equivalent, and voltage dividers, or their equivalent, for each phase of the electrical system to be measured. In digital systems, it is important that the voltage and current for each phase are sampled at the same time so as to accurately preserve their relative phase. Thus, prior art watthour meters have at least two Analog to Digital Converters (ADCs)—one for voltage and the other for current. Multi-phase meters typically have multiplexers at the input of the ADCs to permit simultaneous conversion of the voltage and current inputs from each phase.

Although simultaneous conversion of the V and I waveforms preserves their relative phase, it requires at least two Analog to Digital Converters. This consumes extra power and requires a relatively large die area when implemented in integrated circuits (ICs). Additionally, it means the current waveform, which might be quite small, sometimes less than one percent (1%) of the voltage amplitude, is being processed at the same time as the larger voltage waveform creating a potential for crosstalk between the voltage and current channels. Crosstalk from the voltage channel into the current channel can create unacceptable errors thus significantly degrading the accuracy of the watthour meter. Crosstalk can couple in through power supplies, voltage references, or the die substrate. It can also occur as electrostatic or inductive coupling from nearby conductors.

In actual practice, most watthour meter devices don't actually sample V and I exactly simultaneously. Instead, they permit one of the samples to be delayed slightly in order to compensate for minor phase shifts occurring elsewhere in the meter such as in voltage attenuators (or dividers) or current transformers. These phase adjustments are typically just a few microseconds—far smaller than the one hundred microseconds (100 usecs) or so between conversion samples.

SUMMARY OF INVENTION

Figure 1:
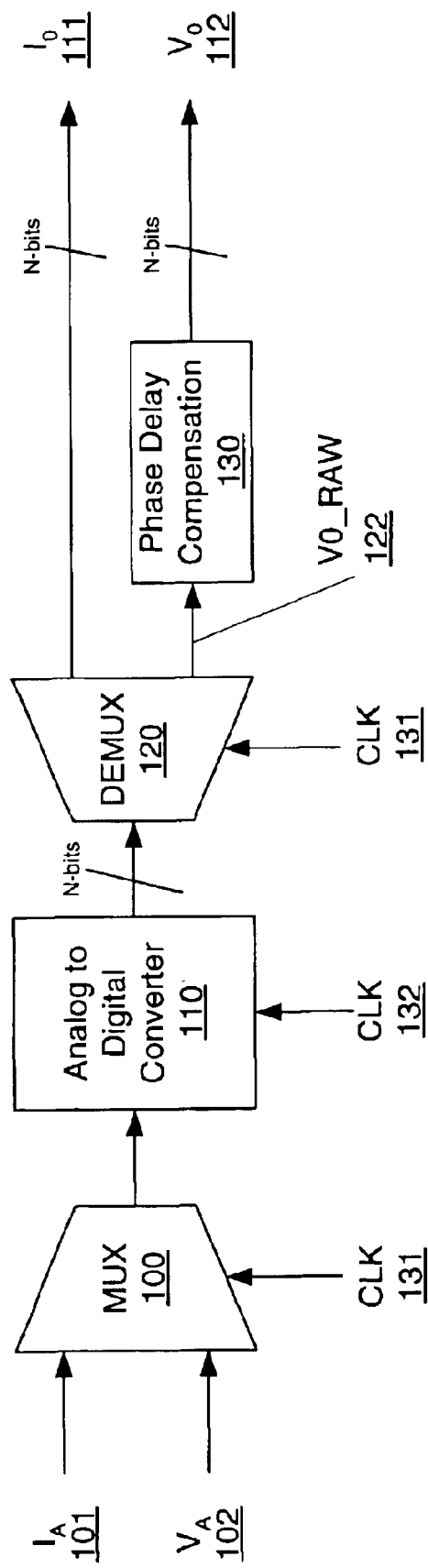
FIG. 1 is an illustration of an in-phase digital current and voltage generation system for use in power computation in a single-phase system, in accordance with an embodiment of the present invention.

The invention comprises a method and apparatus for obtaining power computation parameters. Accurate measurement of power requires the multiplication of voltage and current. Typically, voltage and current are converted to their digital representations before multiplying. Accurate computation of power usage requires multiplying voltage and current at the same instant of time and integrating the results over time. Instruments used for measuring power usage are known as watthour meters.

Watthour meters may be single-phase or multi-phase systems. Single-phase systems measure the power from a single incoming voltage and current. Multi-phase systems are used to measure power from a multi-wave power source. Typical electrical systems are one phase, two phases, or three phases. In one or more embodiments of the present invention a method of using a single Analog to Digital Converter to convert both voltage and current signals for all the phases of any electrical system and then digitally compensating for the phase error caused by the non-simultaneous sampling of the current and voltage signals is provided.

One or more embodiments of the present invention use various compensating filter techniques. Some simple implementations such as an interpolator, an all-pass filter, or a combination of both are presented. A compensation filter of the present invention computes the value of the later sampled variable (e.g., voltage) at the same sample interval of the previously sampled signal (e.g., current) with precision accuracy. An embodiment of the compensation filter allows accurate computation of the value of a signal at any sample interval of the multiplexer. Thus, although in a three-phase system a signal may be sampled every sixth time, the value of the signal may be computed at one of the other sample times.

Alternatively, the compensation filter can employ phase lead to compute the value of the earlier sampled variable at the same sample interval of the later-sampled variable.

A single multiplexer is used to select which signal is processed by the single Analog to Digital Converter. In one or more embodiments, a demultiplexer is used to reverse the multiplexing process. The demultiplexer is implemented in digital circuit. The use of a single multiplexer to schedule the signals for conversion and a single ADC for converting the voltage and analog signals one at a time reduces the potential for crosstalk, reduces power requirement, and reduces die size requirement over prior art systems.

DETAILED DESCRIPTION

The present invention discloses a method and apparatus for obtaining power computation parameters. In the following description, numerous specific details are set forth to provide a more thorough description of the present invention. It will be apparent, however, to one skilled in the art, that the present invention may be practiced without these specific details. In other instances, well known features have not been described in detail so as not to obscure the present invention.

In one or more embodiments of the present invention, a single Analog to Digital Converter (ADC) is used for sampling both Voltage (V) and Current (I). However, since a single converter can only sample the signals one after the other, embodiments of the present invention add compensation circuitry to remove the excess phase delay caused by the non-simultaneous sampling. The use of a single converter results in power and space savings (e.g., die area in ICs) in the circuitry needed for conversion of the analog voltage and current signals to their digital representations. Additionally, since the voltage and current are not being converted at the same time, the potential for crosstalk is significantly reduced.

FIG. 1 is an illustration of an in-phase digital current and voltage generation system for use in power computation in a single-phase system, in accordance with an embodiment of the present invention. As illustrated, input waveform IA 101 and IB 102, proportional to analog current IA and analog voltage VA, are to be converted to their digital representations for power computation. Current can range in value anywhere from a few milliamps to over one hundred amps. Voltage on the other hand depends mostly on the country of interest. For instance, in the United States, the household voltage is nominally 110 Volts while in a majority of countries in the rest of the world the nominal voltage is approximately 240 Volts. Additionally, electrical power supply to most households is in the form of Alternating Current (AC) at 50 Hz or 60 Hz.

In AC systems, current IA 101 and voltage VA 102 are continually changing thus both signals must be multiplied in phase for accurate representation of power. However, Analog to Digital Converter (ADC) 110 can only convert one signal at a time. Thus, multiplexer MUX 100 is used to schedule current IA 101 and voltage VA 102 for conversion at different times. In addition, there is a finite amount of time associated with the Analog to Digital Conversion process in ADC 110. Therefore, MUX 100 must hold the same signal at its output long enough for the conversion process to complete. For instance, assuming ADC 110 takes one hundred microseconds to complete a conversion then multiplexer control clock CLK 131 must run at a maximum rate of $1/(2*100E-06)$ cycles per second (or 5 KHz) to allow for completion of the conversion process before the next signal is presented to the ADC. Input clock CLK 132 is the clock for the Analog to Digital Converter process block 110, which depends on the type of converter in use. Typically, clock CLK 132 is an integer multiple of clock CLK 131.

After each conversion process, Analog to Digital Converter 110 generates an N-bits wide digital representation of the input analog signal. Assuming the N-bits represent a digital word then block DEMUX 120 acts to reverse the multiplexing process of block 100. Therefore, block DEMUX 120 could function as a digital demultiplexer, for example. It will be apparent to those of skill in the arts that MUX block 100 and DEMUX block 120 could be implemented in various ways. For example, MUX 100 and/or DEMUX 120 could be represented with a combination of logic gates such as switches, tri-statable devices, registers, etc. Thus, multiplexer and demultiplexer are used herein for illustrative purposes only to show scheduling of the input analog signals to the converter and obtaining of the correct digital representation of the scheduled signal.

After separation of the digital current and voltage signals in DEMUX 120, the phase shift caused by non-simultaneous sampling of the signals may be corrected for in block 130, for example. Various correction methods may be used. For example, an implementation may choose to advance the phase of the previously sampled signal by using a phase lead network that would provide the needed and known phase advance. Another implementation may choose to delay the phase of the later sampled signal to coincide with the phase of the previously sampled signal, or to delay it a full multiplexer cycle plus an ADC sample time. In this later case, the delayed voltage would be multiplied by a current waveform delayed by a multiplexer cycle. These phase delay approaches will be discussed in more detail in this specification. However, it should be apparent that the present invention is not limited to a phase delay approach.

In one embodiment of the present invention, the voltage signal, VA 102, is sampled after the current is sampled, thus voltage VA 102 is the later sampled signal and would be used to illustrate the phase delay compensation process of block 130. The purpose of the delay compensation is to compensate for the non-simultaneous sampling between current and voltage. As shown in this illustration, Phase Delay Compensation 130 uses the demultiplexed output voltage V0_RAW 122 to generate the digital voltage signal V0 112, which corresponds in phase with the digital current signal I0 111. Phase delay compensation 130 produces a voltage signal, VO 112, which represents the voltage at the time the current (i.e., I0 111) was sampled. Various implementations of Phase Delay Compensation 130 will be discussed in the section entitled "Phase Delay Compensation".

Figure 13:
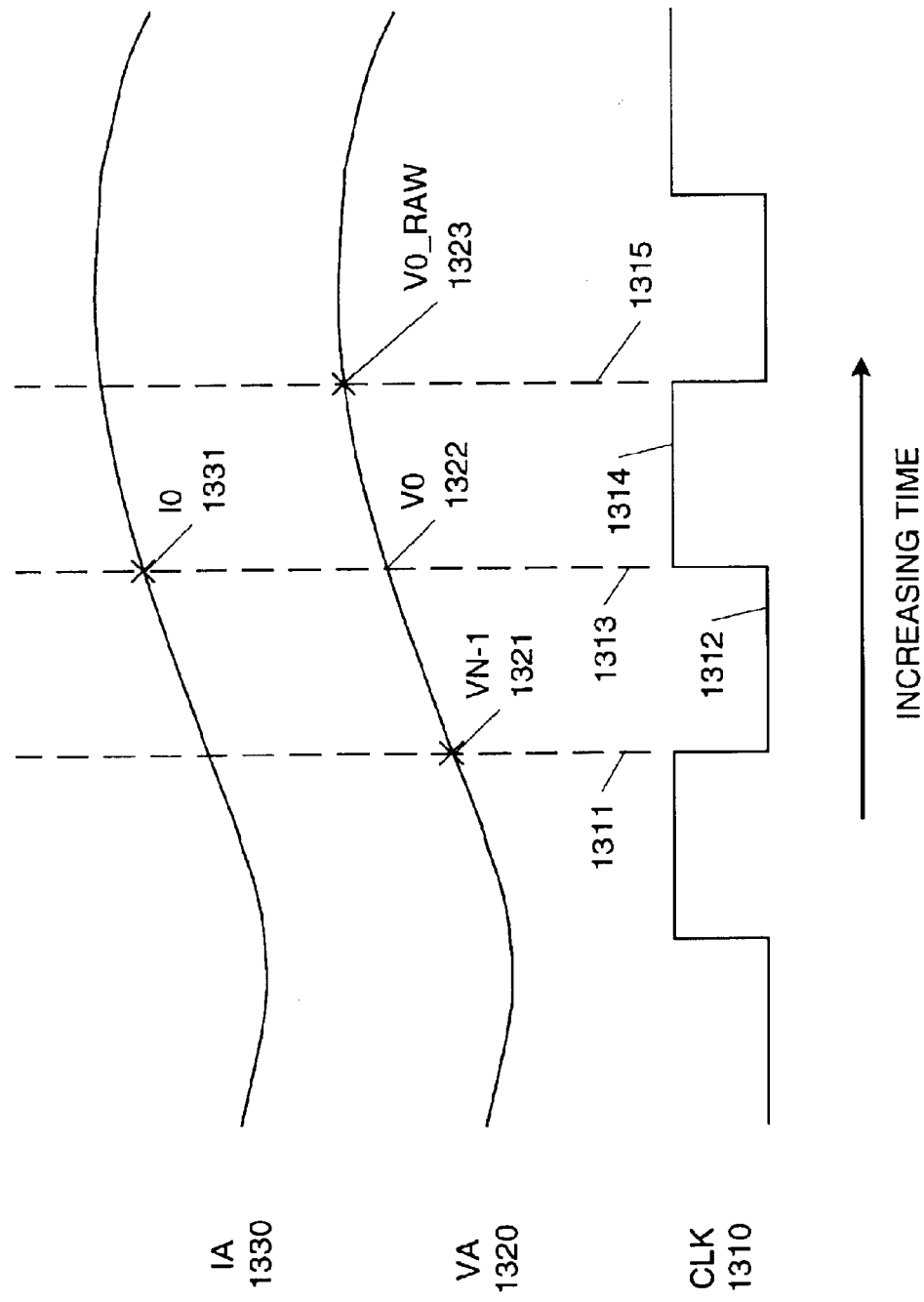
FIG. 13 is a time-history illustrating the desired effect of phase delay compensation.

FIG. 13 is a time-history illustrating the desired effect of phase delay compensation. In this illustration, line 1310 represents the clock signal CLK 131 of FIG. 1; line 1320 represents analog voltage signal VA 102 of FIG. 1; and line 1330 represents analog current IA 101 of FIG. 1, for example. During clock period 1312, the Analog to Digital Converter 110 is converting current signal, IA 1330, to its digital representation, I0 1331. At the end of the conversion period, represented by the clock rising edge 1313, the ADC generates the digital representation of the current. Thus, at time 1313, the digital current I0 1331 is generated as output of the ADC.

Next, the ADC starts sampling the voltage during clock period 1314. At time 1315, the digital representation of voltage V0_RAW 1323 is generated. However, this voltage cannot be multiplied together with the current from the previous ADC sample, I0 1331, to generate an accurate representation of power at any discrete sample instant. To generate the correct power at time 1313 requires multiplying the current I0 1331 by voltage V0 1322. However, voltage V0 1322 is not a sample available as an ADC output. Therefore, it is desirable to estimate the digital representation of voltage, V0 1322, at time 1313.

From the illustration of FIG. 13, it is apparent that a pure delay may not be adequate. For instance, the voltage V0_RAW at point 1323 is higher than the voltage V0 at point 1322 thus if a pure delay (such as a buffer, shift register, etc.) is used, the power computed may be erroneous.

One method of reducing the power computation error is to reduce the conversion time so that the time between samples will be greatly reduced. However, there is a finite amount of time required for conversion thus there is a limit to how much reduction may be achieved. Also, the frequency content of the input analog signal may compromise accuracy. For instance, as the input signal frequency increases, the rate of change of the signals to be sampled increases and the delta between samples increases.

A desirable approach for reducing the error caused by non-simultaneous sampling is to remove any effect sampling may have on power accuracy. One way of achieving the desired result is by interpolating between the present voltage sample VO_RAW 1323 and previous voltage samples, for example, the sample VN-1 1321, which occurred at time 1311. The magnitude of the error, i.e., the difference between the computed value of V0 and the actual value of V0, will depend on the type of and order (i.e., number of states) of interpolation chosen. The desired correction is applied on the digital signal thus only requires programming of the desired algorithm. Since this phase correction is performed in digital logic, the power-measuring device requires little additional real estate and any additional power consumption is minimal.

Multi-Phase Systems

Most electrical systems come in multiple phases thus it is desirable to compute the total power consumption for all the phases. Prior art systems may use different A/D (Analog to Digital) Converters for current and voltage of the different phases. Some prior art systems use two A/D converters: one for current, and the other for voltage. The current signals from all the phases are multiplexed in one multiplexer while the voltage signals from all the phases are multiplexed in a second multiplexer. Conversions of current and voltage to their digital representation are performed simultaneously thereby creating an environment conducive to crosstalk.

Figure 2:
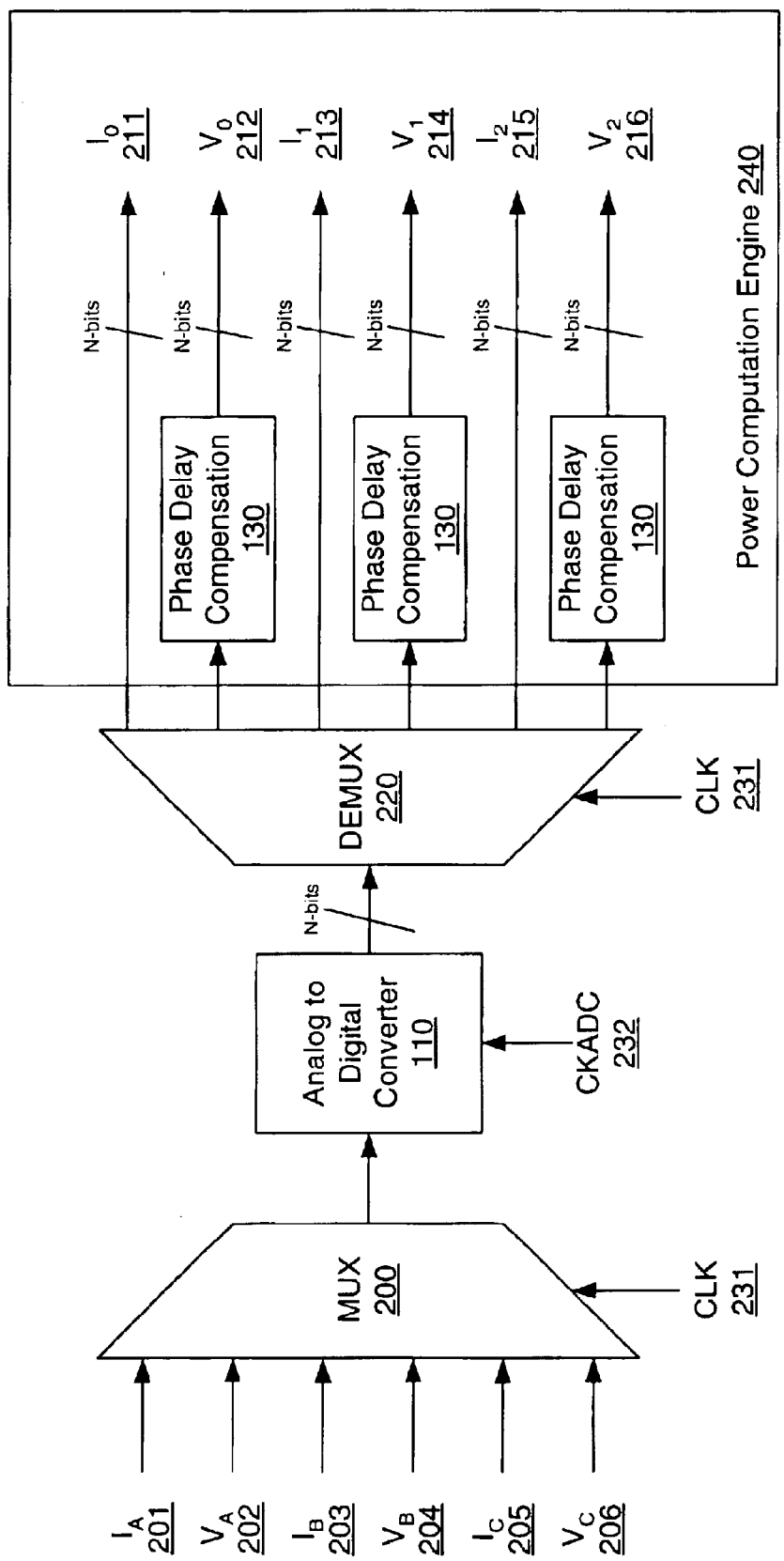
FIG. 2 is an illustration of in-phase conversion of voltage and current in a multi-phase system in accordance with an embodiment of the present invention.

In one or more embodiments of the present invention, one multiplexer and one A/D converter is used for the entire conversion process. FIG. 2 is an illustration of in-phase conversion of voltage and current in a multi-phase system in accordance with an embodiment of the present invention.

As illustrated, analog signals IA 201, IB 203, and IC 205 represent currents from three phases, A, B, and C, of a three-phase electrical system. Analog signals VA 202, VB 204, and VC 206 represent voltages from the three phases (A, B, and C) of the same three-phase electrical system. These signals, 201–206, are to be converted to their digital representation for power computation in a digital processor. Current can range anywhere from a few milliamps to over one hundred amps. Voltage on the other hand depends mostly on the country of interest. In most households, electrical power feeds are Alternating Current (AC) at 50 Hz or 60 Hz. In the United States, the household voltage is nominally 110 Volts while in the rest of the world the nominal voltage is approximately 240 Volts in a majority of countries.

Since current and voltage signals are continually changing, signals from the same electrical system phase (e.g., phase A) must be multiplied in phase for accurate representation of power. However, Analog to Digital Converter (ADC) 110 can only convert one signal at a time. Thus, multiplexer MUX 200 is used to schedule the signals IA 201, VA 202, IB 203, VB 204, IC 205, and VC 206 for conversion. There is a finite amount time associated with the Analog to Digital Conversion process of ADC 110. Therefore, MUX 200 must hold the same signal in position at the input of the ADC long enough for the conversion process to complete. For instance, assuming ADC 110 takes 100 microseconds to complete a conversion then multiplexer control clock CLK 231 must run at a maximum rate of 1/(6*100E−06) cycles per second (or 1.67 KHz) to allow for completion of the conversion process before the next signal is presented to the ADC. Input signal CKADC 232 is the clock for the Analog to Digital Converter. The clock frequency depends on the type of converter in use. Typically, clock CKADC 232 is an integer multiple of clock CLK 231.

After each conversion process, Analog to Digital Converter 110 generates an N-bits wide digital representation of the input analog signal. Assuming the N-bits represent a digital word then block DEMUX 220 acts to reverse the multiplexing process of block 200. Therefore, block DEMUX 220 could function as a digital demultiplexer, for example. It will be apparent to those of skill in the arts that MUX block 200 and DEMUX block 220 could be implemented in various ways. For example, MUX 200 and/or DEMUX 220 could be represented with a combination of logic gates such as switches, tri-statable devices, registers, etc. Thus, multiplexer and demultiplexer are used herein for illustrative purposes only to show scheduling of the input analog signals to the converter and obtaining of the correct digital representation of the scheduled signal. A simplified schematic of an example demultiplexer is shown in FIG. 3.

Figure 3:
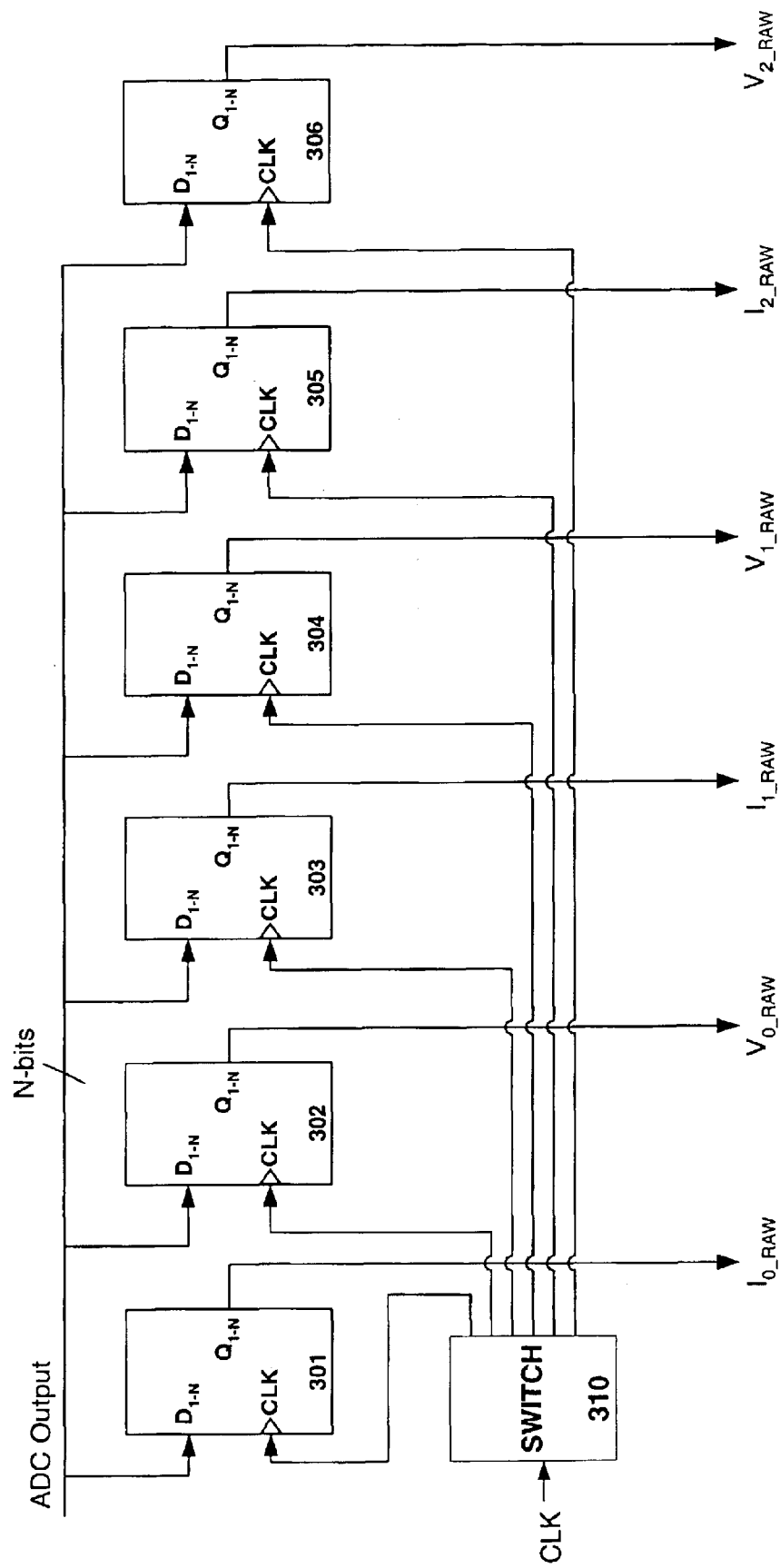
FIG. 3 is a simplified schematic of an example demultiplexer.

As illustrated in FIG. 3, the N-bits output of the A/D Converter (i.e., ADC Output) is connected to the data input ($D_{1-N}$) of six registers 301–306. The registers are then clocked by the output of a switch 310. The switch uses the same clock signal used to clock the multiplexer (e.g., CLK 231 of FIG. 2). Switch 310 may be implemented using a counter, for example, because all that is required is that one of the six outputs of switch 310 be enabled (true) at every clock cycle. Thus, at each clock cycle, the digital data from the A/D converter is stored in the appropriate register when its CLK signal is enabled. In this illustration, the demultiplexed digital data is available as I0_RAW, V0_RAW, I1_RAW, V1_RAW, I2_RAW, and V2_RAW.

Referring back to FIG. 2, after separation of the digital current and voltage signals in DEMUX 220, the phase shift caused by non-simultaneous sampling of signals in each phase must be corrected for using an appropriate correction method. For example, the digital output signals I0 211, and V0_RAW are from the same electrical phase (IA and VA) thus appropriate correction may be added to the voltage (e.g., V0_RAW) to generate the corrected voltage, V0 212, at the sample time of I0 211. Similar corrections need be applied to generate signal pairs I1 213 and V1 214, and I2 215 and V2 216.

Various correction methods may be used to correct the phase error caused by non-simultaneous sampling. For example, an implementation may choose to advance the phase of the first sampled of the two signals in a signal pair by using a phase lead network that would provide the needed and known phase advance. Another implementation may choose to delay the phase of the later sampled signal to coincide with the phase of the previously sampled signal of the same electrical system phase, or to delay it a full multiplexer cycle plus an ADC sample time. These later approaches (phase delay) are discussed in more detail below. However, it should be apparent that the present invention is not limited to a phase delay approach.

Phase Delay Compensation

An undesirable phase shift occurs because, in one or more embodiments of the present invention, voltage (V) and current (I) samples are not taken at the same time. For power accuracy, any phase shift (i.e., delay) caused by non-simultaneous sampling should be removed before the VI product is calculated. The magnitude of the phase delay caused by non-simultaneous sampling is known precisely since it is the difference between the two sample times. One method of removing the phase delay is by passing the second signal sample through a filter that has the same delay as the sample difference. There are many suitable filters. Two simple forms are discussed herein: the interpolator and a single-pole all-pass filter.

As an example of the phase delay caused by non-simultaneous sampling, consider the embodiment discussed in FIG. 2, i.e., a three-phase system with a single A/D converter. The three system phases are labeled A, B, and C. The converter samples are in the following order: IA, VA, IB, VB, IC, and VC. In the illustrations that follow, the converter samples at a 15 KHz rate or once every 67 usecs (67 microseconds). Since proper calculation of power requires VA*IA, VB*IB, and VC*IC, each voltage waveform must be delayed 67 usecs to align with its current waveform. This phase delay compensation may be done with any suitable digital correction filter.

Some correction filters behave better if their delay is at least a full multiplexer cycle plus the conversion cycle (e.g., 67 usecs). In embodiments employing a delay comprising a number of multiplexer cycles plus conversion time, the filter output would be multiplied by the current sample in the corresponding multiplexer cycle. For instance, if the filter delay is one multiplexer cycle plus ADC conversion time, then the corresponding current sample is the sample immediately before the most recent one.

An appropriate correction filter should have a flat frequency response while providing the appropriate delay. For instance, for a 50 Hz to 60 Hz system, the filter should provide a delay approximating the sample time for signals in the 50 Hz to 60 Hz region. As the frequency of the input signal rises, and particularly as it approaches one half of the sample frequency, the magnitude response and/or delay of the filter may deviate. However, an appropriate filter should be chosen to comply with any given specification requirements. For instance, many watthour meters have accuracy specifications for harmonics up to twenty-three times the input frequency. The deviations of the chosen filter must be compatible with specifications such as these.

Figure 4:
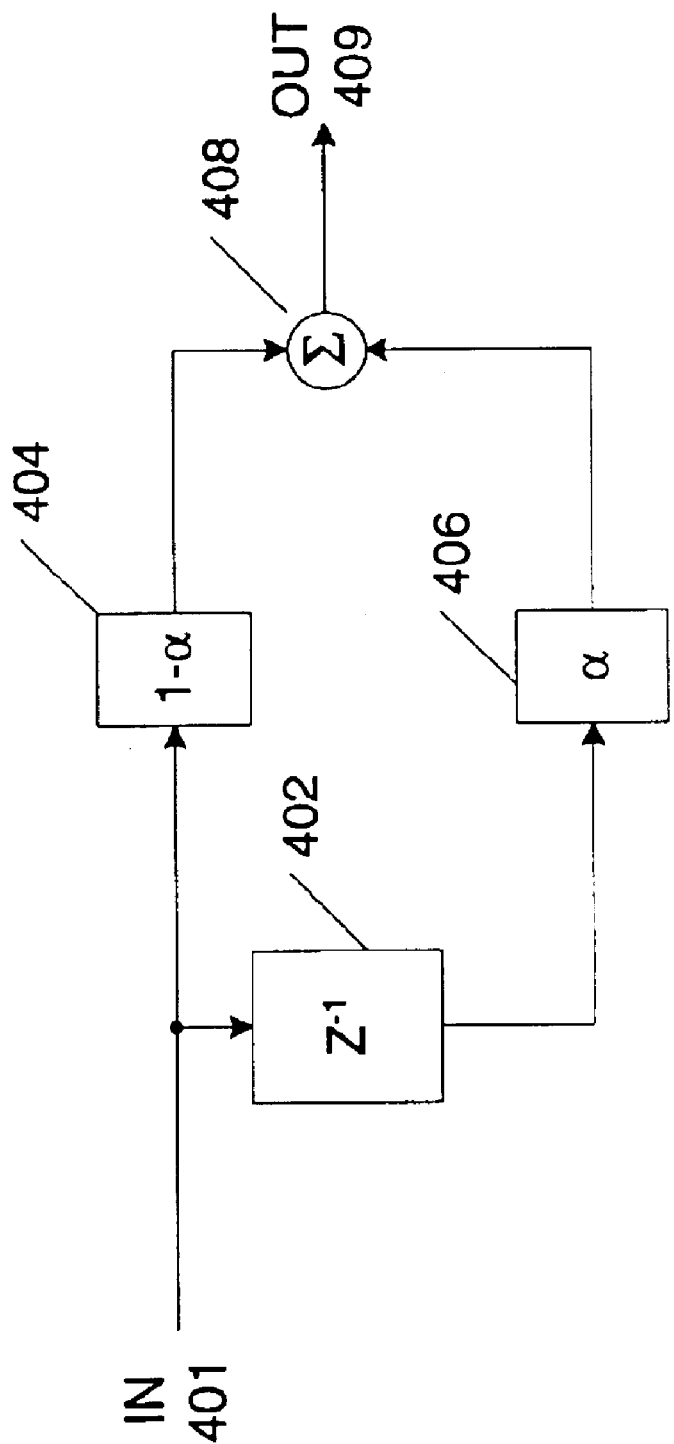
FIG. 4 is an illustration of a first order interpolation filter in accordance with an embodiment of the present invention.

One embodiment of a correction filter (Phase Delay Compensation Circuit) is an interpolator that replaces V0_RAW, the present VA sample, with a weighted sum of V0_RAW and the past VA sample, VN-1 (see FIG. 13). FIG. 4 is an illustration of a first order interpolation filter in accordance with an embodiment of the present invention. In this illustration, the present value, IN 401, of the signal to be interpolated (e.g., voltage V0_RAW) is multiplied by a coefficient 1–α and then passed to summer 408. The input signal is also passed through digital delay block 402 to generate a signal which represents the past sample of the signal IN 401 (e.g., VN-1). This past sample of the input signal is then multiplied by a coefficient α in block 406 before being summed at block 408 with the signal from block 404. The interpolation filter output signal, OUT 409, is the output of summer block 408 and should approximate the output of the signal at the desired sample time.

The z-domain transfer function of this filter is $H(z)=1-\alpha(1-z^{-1})$. It should be noted that α is substantially equivalent to the desired number of sample (e.g., multiplexer samples) delays of the sampler divided by the total number of elements being sampled by the sampler. For instance, in the embodiment of FIG. 2 six variables are being sampled. To correct for the phase introduced by non-simultaneous sampling, the value of the voltage (V0) need be computed at the sampling point of the current (I0), which is one sample back, as illustrated in FIG. 13. Thus, the desire is to go one sample back of the multiplexer and since the total number of variables being sampled is 6, the coefficient α is approximately ⅙ for this one-sample delay interpolation.

However, the best value of α may deviate slightly from ⅙ as a function of the input frequency, phase delays caused by hardware components in the path of the signals to be converted, and the ADC sample frequency. The interpolator works well when the waveform's sample frequency is high compared to its input frequency. As the input frequency approaches the sample rate, the magnitude and delay of the interpolator output both deviate from their nominal values (e.g., values at 50 Hz or 60 Hz). In the 50 Hz to 60 Hz region, the phase error of this interpolation filter is less than 0.0008 degrees and the magnitude error is less than 0.06% for a 2.5 KHz multiplexer sampling frequency. For two-sample delay interpolation, α may be set to ⅖. In this configuration, the phase error is less than 0.0006 degrees and the magnitude error is less than 0.1% at the 50 Hz to 60 Hz region.

If better accuracy is needed, higher order interpolators may be used. This may be accomplished by simply adding successive delay states and coefficients to the circuit of FIG.

4. For instance, a second order simply requires passing the output of block 402 through a second delay block and multiplying the output of the second delay by a second coefficient before summing at junction 408. Of course, the coefficients in blocks 404 and 406 may need to be adjusted appropriately.

Figure 5:
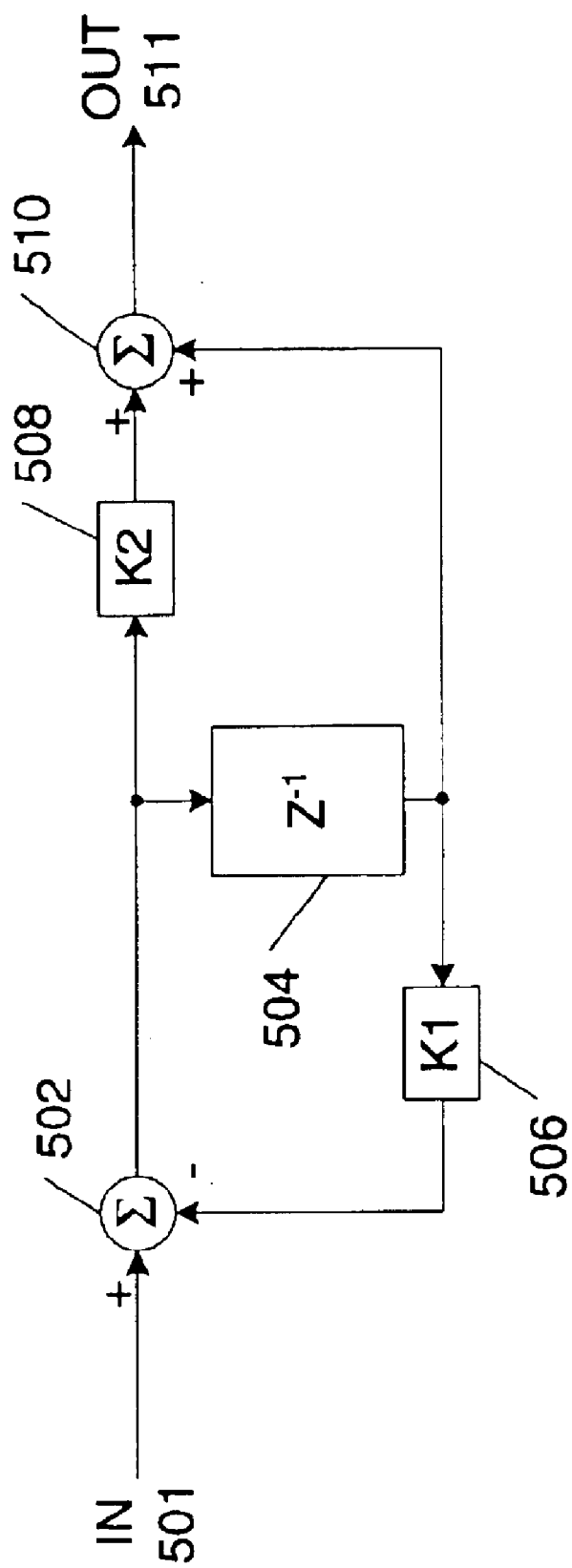
FIG. 5 is an illustration of a first order all-pass filter, in accordance with an embodiment of the present invention.

Another embodiment of a correction filter (Phase Delay Compensation circuit) is a delay circuit implemented as an all-pass filter. FIG. 5 is an illustration of a first order all-pass filter, in accordance with an embodiment of the present invention. Summer 502 generates an error, using negative feedback, between the input signal, IN 501, and the output of block 506, which is the feedback signal. Gain block 506 receives its input from block 504, which is a digital delay block. Block 504 and gain block 508 receive their inputs from the output of summing block 502. The outputs of block 508 and block 504 are summed in block 510 to generate the output signal, OUT 511. This filter mechanization produces a constant amplitude response at all frequencies in embodiments where K1 (block 506) is equal to K2 (block 508).

However, its delay varies with input frequency, but the overall error caused by delay and magnitude deviations is substantially better than the interpolator of FIG. 4 for one-sample delay compensation. The phase delay implementation of FIG. 5 uses bi-linear transformation so that K1=K2=A. The transfer function for this all-pass filter can be written as $H(z)=(Az+1)/(z+A)$.

In one or more embodiments, the all-pass filter may be designed with a delay of ⅙ or ⅞ of the waveform sample rate. The later frequency may provide better performance for high frequency harmonics of the input. In the later case, the resulting voltage sample would be multiplied by the current sample before the most recent one. In a similar fashion, delays of $(n+1/6)T$ may be chosen, where $1/T$ is the waveform sample rate and n is the number of multiplexer cycles. In all cases, the delay value of the all-pass filter may be perturbed slightly to compensate for minor phase shifts occurring elsewhere in the system (e.g., watthour meter).

Those of ordinary skill in the arts will appreciate that constants K1 and K2 will depend on the type of transformation used to implement the desired all-pass filter and any desired additional phase adjustments. In addition, although only a first order all-pass filter is described herein, the present invention is not so limited to such implementation. Higher order filters may be used depending on application and accuracy requirements.

An Example Invention Construction

Figure 6:
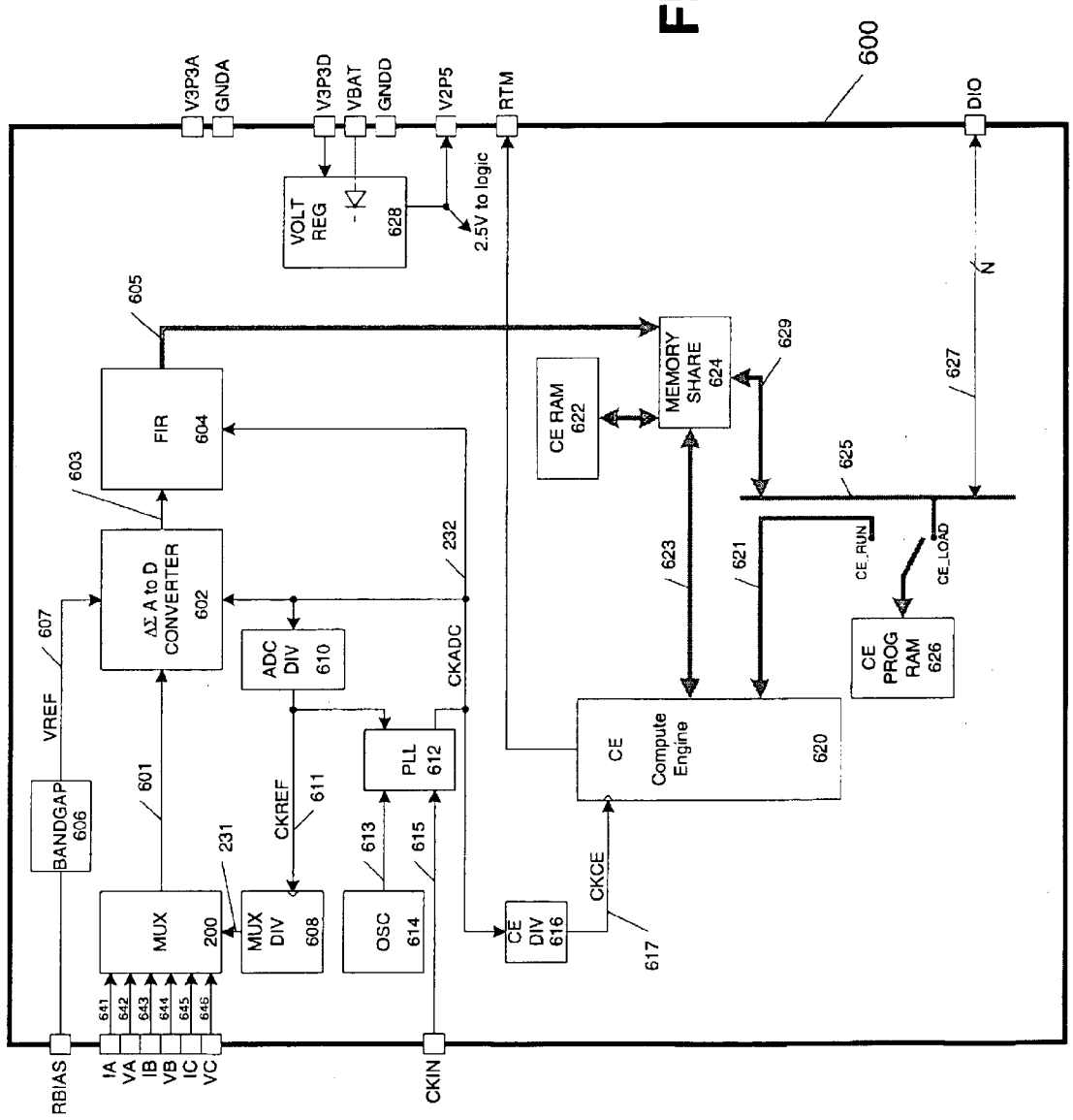
FIG. 6 is general schematic diagram illustrating an embodiment of the present invention for a three-phase electrical system.

FIG. 6 is general schematic diagram illustrating an embodiment of the present invention for a three-phase electrical system. In this embodiment, block 600 may represent an Integrated Circuit device with only portions relevant to the present invention shown. The three phases of current and voltage: IA and VA; IB and VB; and IC and VC, are provided as inputs to MUX 200 via signal paths 641 through 646. Using clock from signal path 231, MUX 200 generates a single output signal which it provides to A to D Converter block 602 via path 601. A to D Converter block 602 uses Delta-Sigma (also known as Sigma-Delta) conversion methods for generating a one-bit digital output stream at path 603. Delta-Sigma converter block 602 uses a high precision voltage source, VREF 607, for power. Voltage VREF is generated by bandgap device 606 which receives a bias voltage from pin RBIAS.

The 1-bit digital output stream of the delta-sigma converter feeds into a decimation filter of the Finite Impulse Response type, FIR 604. The decimation filter converts the 1-bit stream input data to an N-bits digital output data. MUX 200, A/D converter 602, and FIR 604 run on clock cycles originating from PLL 612. The complete A to D converter process comprises both the delta-sigma converter block 602 and the FIR block 604. An embodiment of this converter process is discussed in more detail using FIG. 7.

The system clock is generated in Phase Lock Loop (PLL) 612. PLL 612 receives input reference clock either from Oscillator 614 or from an external source via pin CKIN and path 615. The phase lock loop, 612, generates the clock CKADC at output 232 using a type of voltage controlled oscillator. PLL 612 also receives feedback from its output clock CKADC divided by a predetermined constant in block ADC DIV 610. The divider reduces the feedback frequency back to the input reference frequency (e.g., OSC 614). The PLL feedback signal is labeled CKREF in path 611. At a steady state, the signal at CKREF 611 and the reference oscillator source (either in path 613 or path 615) will be equal. Thus, ADC clock signal CKADC is an "ADC DIV" multiple of the reference oscillator clock.

Multiplexer clock 231 depends on the conversion time of the ADC. Therefore, the converter clock CKADC 232 must be scaled to generate the MUX clock, 231. MUX clock 231 must be less than or equal to the converter clock frequency, CKADC, divide by the number of signals being converted (i.e., 6) and divide by the number of taps in the decimation filter, FIR 604. In the embodiment shown in FIG. 6, MUX DIV divides the clock CKREF to generate the MUX clock signal 231. Thus, "MUX DIV" should have a value approximately equal to the number of signals being converted (i.e., 6), multiplied by the number of taps in FIR 604, and divided by the value of "ADC DIV".

Figure 7:
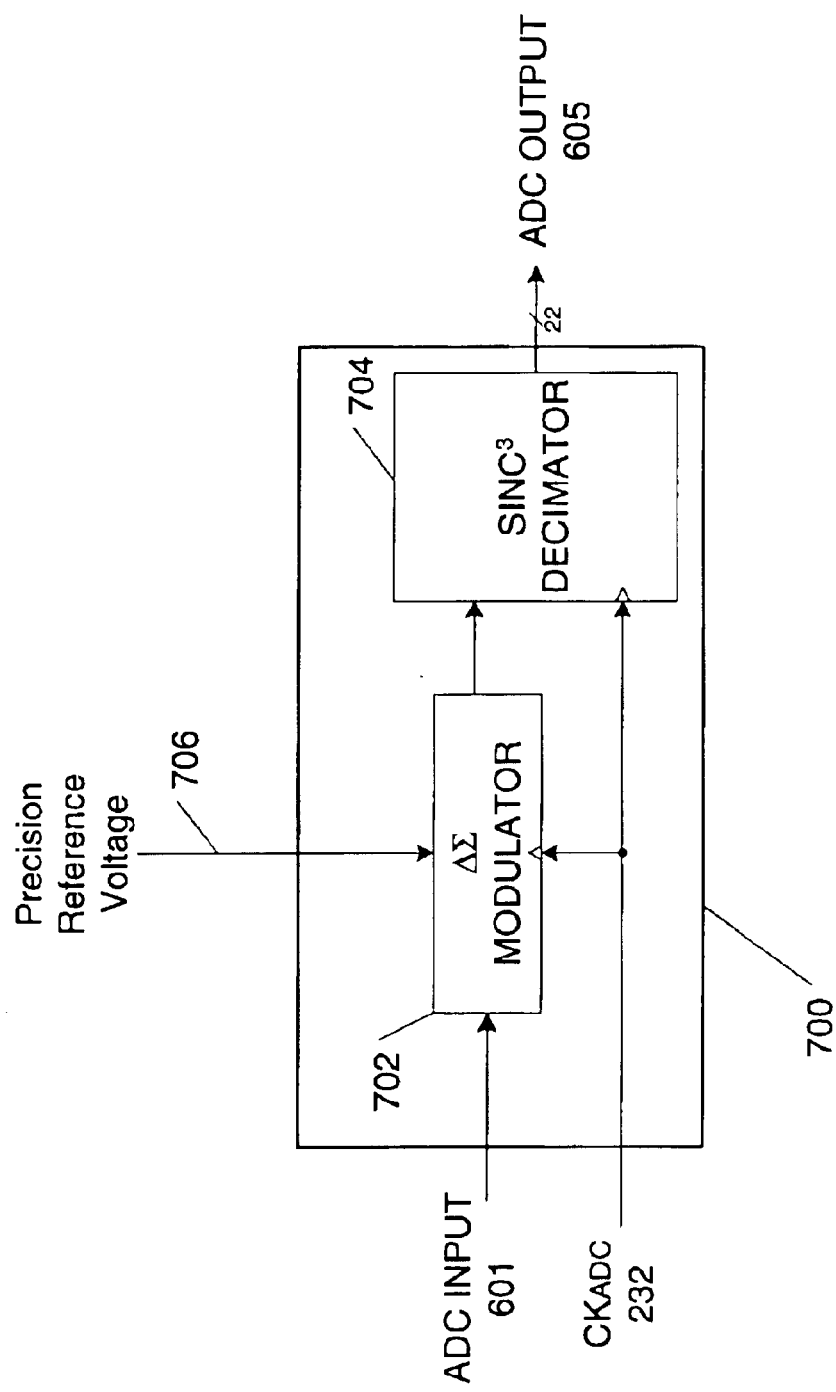
FIG. 7 is an illustration of a delta-sigma A to D conversion process.

FIG. 7 is an illustration of a multi-bit delta-sigma A to D conversion process abstracted from FIG. 6. Block 700 represents the entire delta sigma ADC. This implementation of a delta-sigma ADC comprises delta-sigma modulator block 702 and Sinc$^3$ decimator filter block 704. ADC input 601 and ADC output 605 represent the same signals in FIG. 6. The delta-sigma modulator may be of any desired order or type depending on the accuracy requirements, stability requirements, and other factors like space and power. Delta-Sigma modulator 702 uses power from a precision voltage source, such as a bandgap device, to power its conversion circuits. The modulator and the decimator use the same clock signal CKADC 232. The conversion clock of a delta-sigma modulator will depend on loop stability of the chosen delta-sigma configuration. Thus, a user's ability to set the conversion time is limited mostly by stability considerations for any given delta-sigma configuration.

Referring back to FIG. 6, the various clock frequencies in this embodiment may be as follows. Each of the IA, VA . . . VC waveforms are sampled at 2.520 KHz. This is also the system sample rate and is the value used in calculating the $z^{-1}$ terms in FIGS. 8, 9, and 11. Assuming ADC Sinc$^3$ filter has 288 taps. Then each of the six ADC conversions may be allocated 300 conversion clocks (the extra 12 clocks are used for ADC initialization). Assuming that ½ conversion time is needed for offset correction in the bandgap reference. Then there should be enough time for 6.5 ADC conversion cycles during each MUX cycle. Therefore, the ADC clock frequency is 4.91 MHz. Thus the time between ADC samples is 2/13 of the waveform sample rate. This is the value that should be compensated in the correction filter. Finally, with the frequency of reference oscillator 614 at 32.768 KHz, the ADC DIV 610 ratio is 150, and the MUX DIV 608 ratio is 13.

After processing, output 605 of the ADC process (blocks 602 and 604) is stored in shared memory 624. Compute engine 620 obtains the converted signals from shared memory 624, and depending on the desired power equation selected (see FIG. 12), computes the phase delay compensation and power values. Compute Engine 620 is a digital microcomputer running at clock frequency CKCE 617. Clock CKCE is generated from CKADC by dividing the later by CE DIV 616. In one or more embodiments, CKCE is the same frequency as the MUX frequency 231. Compute Engine 620 may be programmable via port DIO and bus 627. Compute Engine's program memory is located in block 626 and its RAM memory is located in block 622.

Block 600 receives power from regulator VOLT REG 628. Regulator 628 regulates power from the input source V3P3D (3.3 Volts source) to digital components in device 600. Regulator 628 may also receive battery input VBAT for backup in case of power failure. Voltage pin V3P3A is the voltage source for powering analog components in device 600. In some implementations, pins V3P3A and V3P3D may be connected externally to a single power source. Pins GNDA and GNDD are analog and digital grounds respectively. Performance of device 600 may be monitored in real-time via pin labeled RTM.

In one or more embodiments, compute engine 620 includes algorithms for compensating for DC offset in the converted signal, for calibrating the current and voltage signals, compensation for phase delay caused by non-simultaneous sampling, and for power computation based on the desired equation. Device 600 may be fully programmable. For example, MUX 200 and the clock signals may be programmed depending in the desired power equation.

Figure 8:
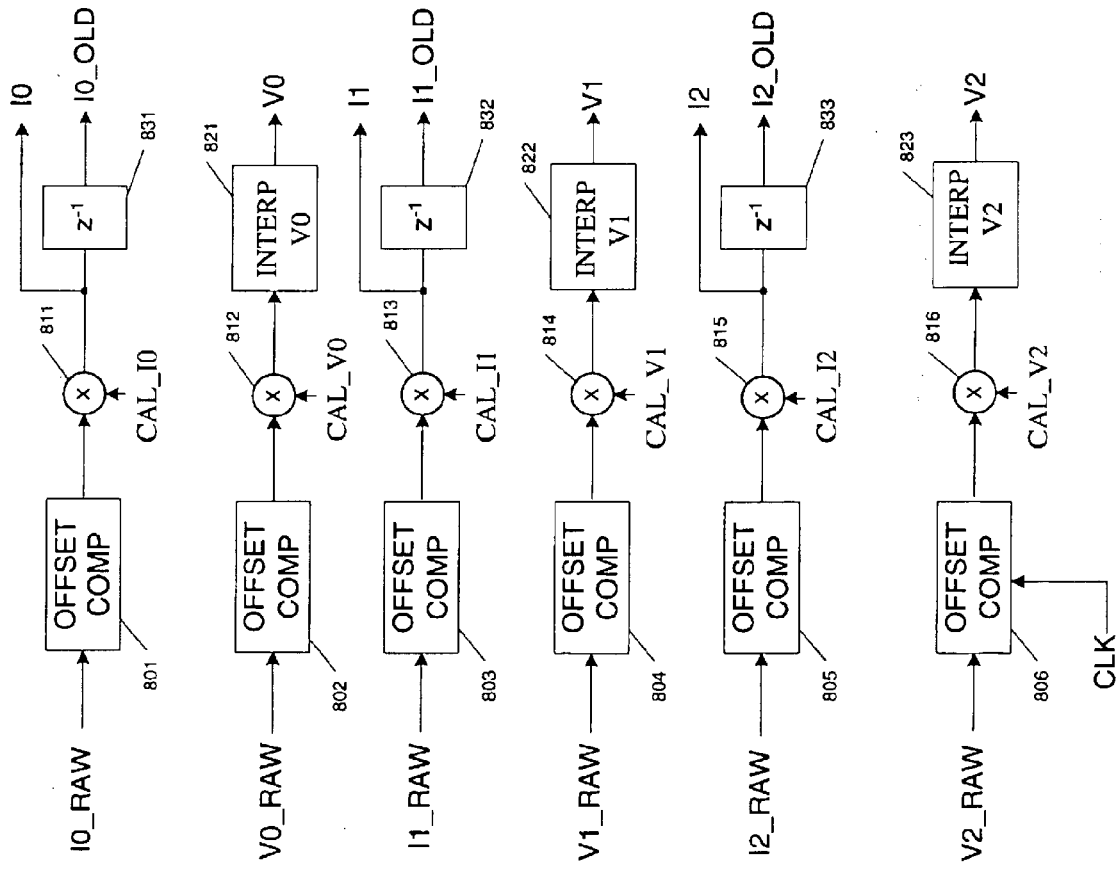
FIG. 8 is an illustration of a compensation scheme in accordance with an embodiment of the present invention.

Before computing power, the compute engine applies compensation to the digital current and voltage signals. FIG. 8 is an illustration of a compensation scheme in accordance with an embodiment of the present invention. At blocks 801–806, the signals are compensated for any DC (steady state) offset introduced by the A/D converter and any other pre-process involved in signal conversion. The compute engine subsequently applies calibration compensation in blocks 811–816. After calibration, the voltage signals (i.e., in this instance the later sampled signal of each phase) are corrected for phase delay in blocks 821–823 using first order all-pass filters with a delay of $15/13$ of a 2.520 KHz sample time. Each delay in the current path, blocks 831–833, compensates for the extra cycle delay in the all-pass networks.

Figure 9:
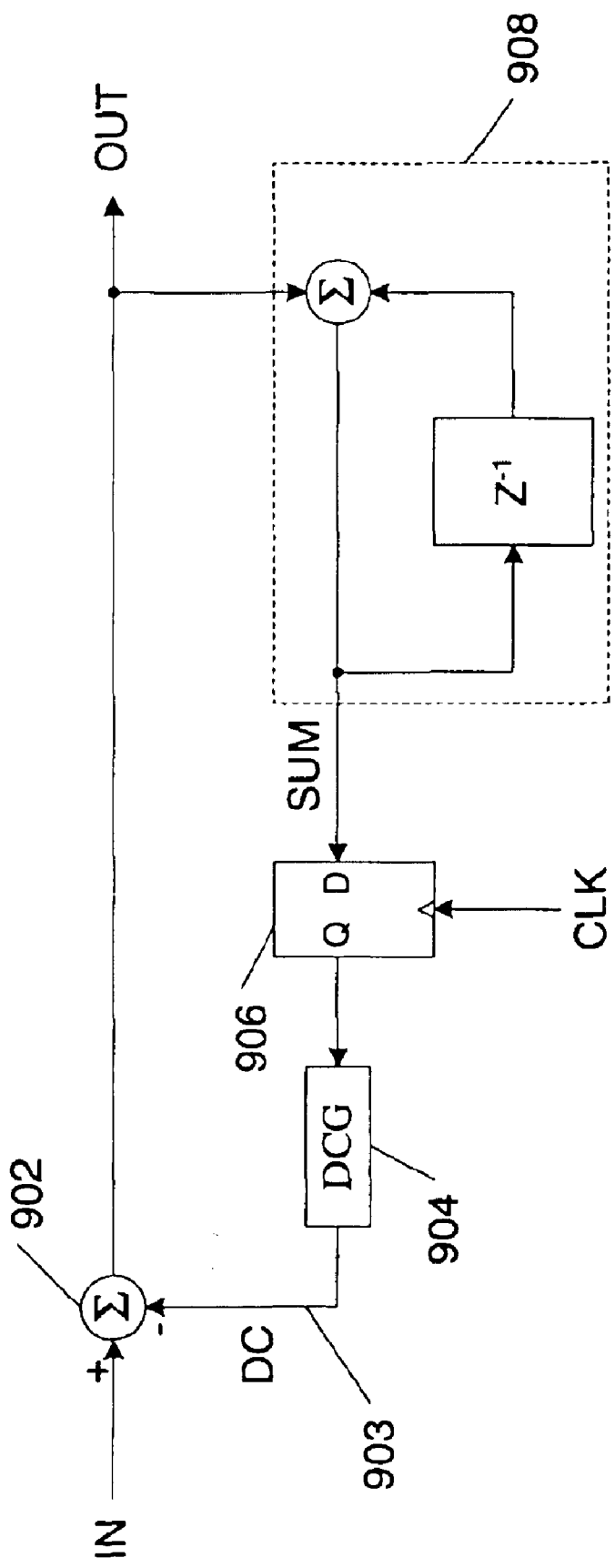
FIG. 9 is an illustration of an offset compensation scheme in accordance with an embodiment of the present invention.

One embodiment of offset compensation is shown in FIG. 9. The circuit shown in FIG. 9 behaves like a high-pass filter thus rejecting any DC offsets from the input signal. As illustrated, DC offset 903 is computed and subtracted from the input signal, IN, in block 902 to generate the output signal, OUT. Block 908 represents a digital integrator operating on the output signal. The output of block 908, SUM, is stored in register 906. Output of register 906 is multiplied by a gain "DCG" in block 904 to generate DC offset signal 903.

Figure 10:
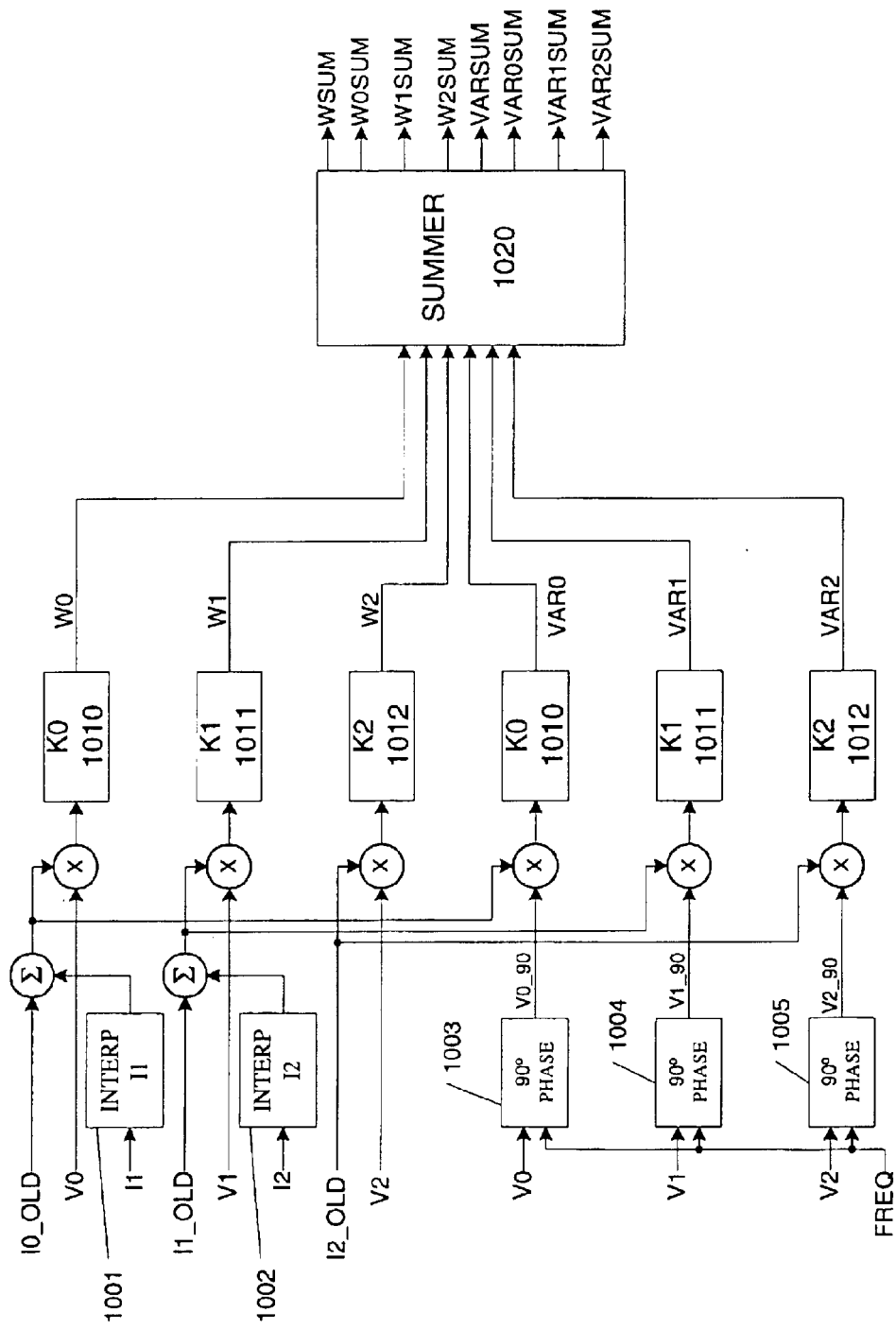
FIG. 10 is an illustration of computation of the standard power equations.
Figure 12:
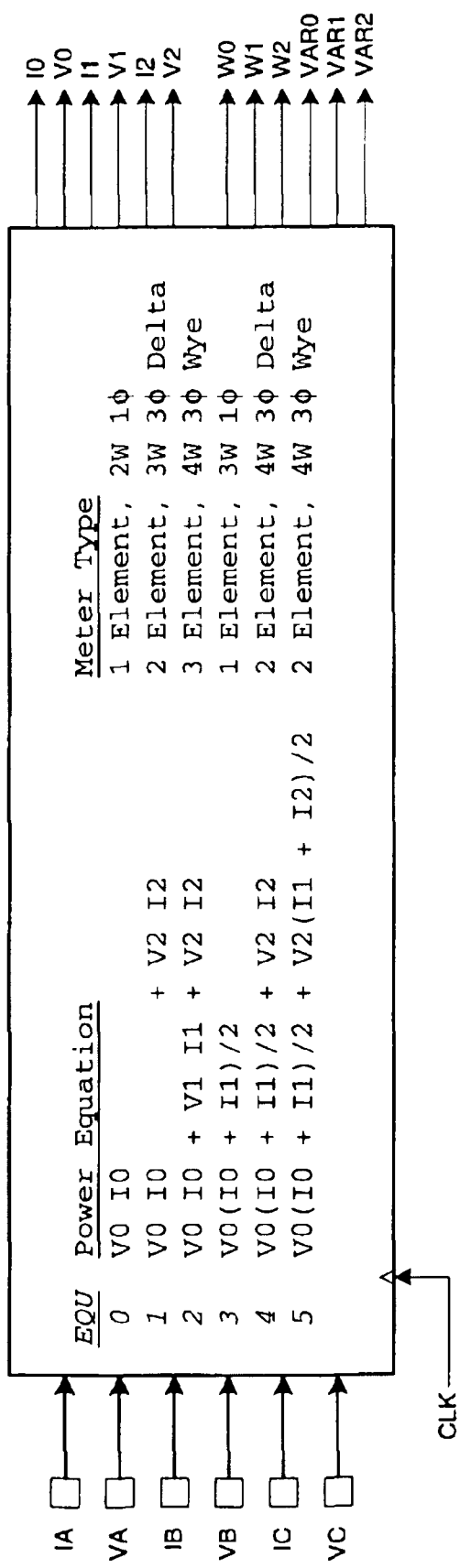
FIG. 12 lists the six standard power equations that may be implemented in the compute engine.

FIG. 12 lists the six power equations that may be implemented in the compute engine. These power equations are implemented in FIG. 10. Note that these are standard power equations and are only included herein for convenience. Referring back to FIG. 10, blocks 1001 and 1002 represent all-pass filters with delays set to $17/13$ for equations EQU 3 through EQU 5. This is because the current (I) of the next phase is sampled two ADC conversion times later than the current of the previous phase. For instance, I1 is sampled two conversion cycles after I0 is sampled. Therefore, I1 must be corrected to the sample time of I0 (i.e., two samples prior) if power is to be computed accurately. Note that the transfer functions in blocks 1001 and 1002 should be zero for equations EQU 0 through EQU 2.

In blocks 1010 through 1012, the coefficients [K0, K1, K2] of the desired equation are applied to generate power elements W0, W1, and W2. Each coefficient may have a value of 0, ½, or 1. For instance, for equation EQU 0, the coefficients should be [1,0,0] because only power from one phase is desired. Thus, the coefficient for equation EQU 2 should be [1,1,1] because the powers from all three phases are summed together.

Figure 11:
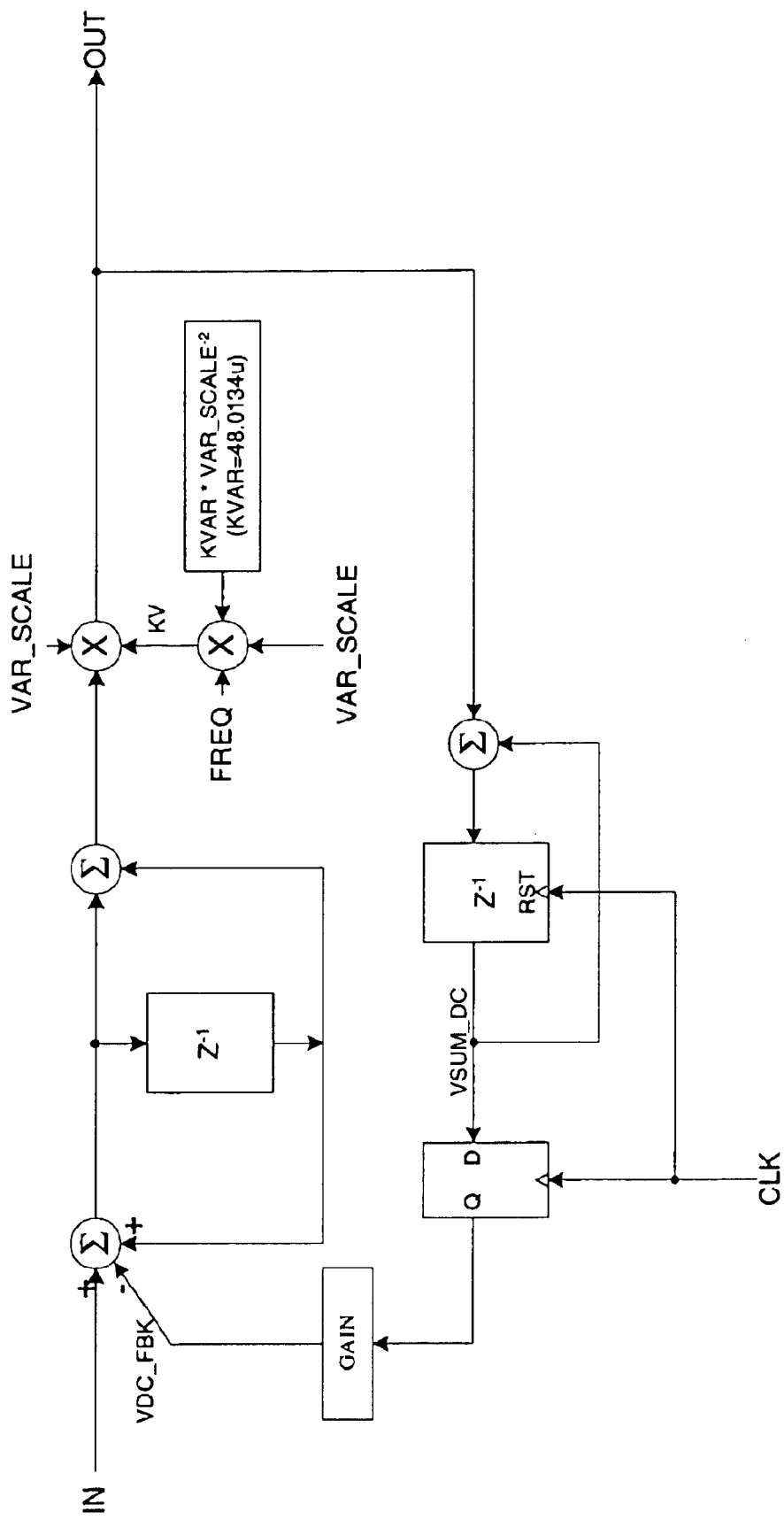
FIG. 11 is an illustration of a 90 degree phase shifter in accordance with an embodiment of the present invention.

To calculate the standard Volt-Amps-Reactive values, VAR0–VAR2, blocks 1003 through 1005 applies a 90 degrees phase shift to each voltage signal before multiplying by the current to calculate power. An embodiment of a 90-degree phase shifter in accordance with an embodiment of the present invention is illustrated in FIG. 11. An optimum value for the variable VAR_SCALE should be greater than 3000/FREQ/KVAR; where FREQ is the electrical system frequency, i.e., 50 Hz or 60 Hz. The value of 48.0134 u (i.e., $48.0134 \times 10^{-6}$) shown for KVAR gives approximately 0.03% unity gain error between 50 Hz and 60 Hz at a MUX sampling frequency (also system clock) of 2.5 KHz. Ideally, the value for KVAR should be 48.0279 u at 60 Hz and 48.0001 u at 50 Hz. The optimum value of KVAR is weakly dependent on system clock frequency. For instance, the optimum value of KVAR at clock frequency of 5 KHz is 47.95599 u, which is a shift of 0.12% from the value shown for 2.5 KHz. It should be noted that the angular error is zero and is independent of the value of KVAR.

Finally, summer 1020 integrates all the power over time to generate the total power consumption.

Thus, a method and apparatus for obtaining power computation parameters have been described. Particular embodiments described herein are illustrative only and should not limit the present invention thereby. The invention is defined by the claims and their full scope of equivalents.

What is claimed is:

1. A method for obtaining power computation parameters comprising:
    generating a single analog signal from a plurality of multi-phase analog signals, wherein said single analog signal takes on a value of one of said plurality of multi-phase analog signals at each cycle of a first clock signal;
    converting said single analog signal to a digital representation using a second clock signal;
    generating a plurality of digital signals from said digital representation, wherein each one of said plurality of digital signals represents a digital form of one of said plurality of multi-phase analog signals; and
    obtaining power computation parameters by compensating said plurality of digital signals for differences in sample interval thereby providing digital values of all signals in each phase of said plurality of multi-phase analog signals at the same sample time.

2. The method of claim 1, wherein said compensating said plurality of digital signals comprises computing equivalent digital values at the same clock time for all analog signals in each phase of said plurality of multi-phase analog signals.

3. The method of claim 2, wherein said computing equivalent digital values comprises passing an appropriate one of said plurality of digital signals from each of said phase through an interpolation filter.

4. The method of claim 2, wherein said computing equivalent digital values comprises applying a high order interpolation circuit to an appropriate one of said plurality of digital signals in each of said phase.

5. The method of claim 2, wherein said computing equivalent digital values comprises passing an appropriate one of said plurality of digital signals from each of said phase through an an allpass filter.

6. The method of claim 1, wherein said converting said single analog signal comprises using oversampling techniques to convert said analog signal to said digital representation.

7. The method of claim 1, wherein said first clock signal is an integer multiple of said second clock signal.

8. A method for computing power comprising:
   selecting a first analog signal from two analog signals comprising a current signal and a voltage signal;
   converting said first analog signal to a first digital representation using an analog to digital converter at a first sample interval;
   making said first digital representation available as a first digital signal;
   selecting a second analog signal of said two analog signals;
   converting said second analog signal to a second digital representation using said analog to digital converter at a second sample interval;
   computing a second digital signal representing said second analog signal at said first sample interval using said second digital representation; and
   computing electrical power consumption using said first digital signal and said second digital signal.

9. The method of claim 8, wherein said computing said second digital signal comprises using said second digital representation at said second sample interval and at least one previous sample of said second digital representation in an interpolation filter.

10. The method of claim 8, wherein said computing said second digital signal comprises using said second digital representation at said second sample interval and a plurality of previous samples of said second digital representation in a high order polynomial interpolator.

11. The method of claim 8, wherein said computing said second digital signal comprises passing said second digital representation through an allpass filter.

12. An apparatus for obtaining power computation parameters comprising:
   a multiplexer for generating a single analog signal from a plurality of multi-phase analog signals, wherein said single analog signal takes on a value of one of said plurality of multi-phase analog signals at each cycle of a first clock signal;
   an analog to digital converter converting said single analog signal to a digital representation using a second clock signal;
   a demultiplexing device generating a plurality of digital signals from said digital representation, wherein each one of said plurality of digital signals represents a digital form of one of said plurality of multi-phase analog signals; and
   a phase correction circuit compensating said plurality of digital signals for sample skew associated with said converting in said analog to digital converter to obtain digital samples values at the same sample interval, wherein said phase correction circuit is not a phase delay.

13. The apparatus of claim 12, wherein said compensating said plurality of digital signals comprises computing equivalent digital values at the same clock time for all analog signals in each phase of said plurality of multi-phase analog signals.

14. The apparatus of claim 13, wherein said computing equivalent digital values comprises passing an appropriate one of said plurality of digital signals from each of said phase through an interpolation filter.

15. The apparatus of claim 13, wherein said computing equivalent digital values comprises applying a high order interpolation circuit to an appropriate one of said plurality of digital signals in each of said phase.

16. The apparatus of claim 13, wherein said computing equivalent digital values comprises passing an appropriate one of said plurality of digital signals from each of said phase through an allpass filter.

17. The apparatus of claim 12, wherein said analog to digital converter uses oversampling techniques to convert said analog signal to said digital representation.

18. The apparatus of claim 12, wherein said analog to digital converter is a delta-sigma converter.

19. The apparatus of claim 12, wherein said first clock signal is an integer multiple of said second clock signal.

20. An apparatus for computing power comprising:
   a multiplexer selecting a first analog signal from two analog signals at a first sample interval, said multiplexer selecting a second analog signal of said two analog signals at a second sample interval;
   an analog to digital converter converting said first analog signal to a first digital representation at said first sample interval, said analog to digital converter converting said second analog signal to a second digital representation at said second sample interval;
   a demultiplexing device parsing said first digital representation as a first digital signal said second digital representation as a second digital signal; and
   a power computation circuitry having a phase correction circuit for generating a third digital signal representing a digital equivalent value of said second analog signal at said first sample interval using said second digital signal, said power computation circuitry computing electrical power consumption using said first digital signal and said third digital signal.

21. The apparatus of claim 20, wherein said two analog signals comprise a current signal and a voltage signal.

22. The apparatus of claim 20, wherein each of said two analog signals has a plurality of corresponding phases.

23. The apparatus of claim 22, wherein each of said plurality of corresponding phases are sampled in order.

24. The apparatus of claim 20, wherein said phase correction circuit is an interpolation filter comprising digital circuit using said second digital representation at said second sample interval and at least one previous sample of said second digital representation.

25. The apparatus of claim 20, wherein said phase correction circuit is a high order polynomial interpolator comprising digital circuit using said second digital representation at said second sample interval and a plurality of previous samples of said second digital representation.

26. The apparatus of claim 20, wherein said phase correction circuit is an allpass filter comprising digital circuit using said second digital representation.

27. The apparatus of claim 20, wherein said analog to digital converter is a delta-sigma converter.

* * * * *